(12) United States Patent  (10) Patent No.: US 7,427,549 B2
Mathew et al.  (45) Date of Patent: Sep. 23, 2008

(54) METHOD OF SEPARATING A STRUCTURE IN A SEMICONDUCTOR DEVICE

(75) Inventors: Leo Mathew, Austin, TX (US); Ramachandran Muralidhar, Austin, TX (US); Veeraraghavan Dhandapani, Round Rock, TX (US)

(73) Assignee: Freescale Semiconductor, Inc., Austin, TX (US)

( * ) Notice: Subject to any disclaimer, the term of this patent is extended or adjusted under 35 U.S.C. 154(b) by 306 days.

(21) Appl. No.: 11/278,180

(22) Filed: Mar. 31, 2006

(65) Prior Publication Data

US 2007/0238278 A1  Oct. 11, 2007

(51) Int. Cl.
*H01L 21/336* (2006.01)

(52) U.S. Cl. .............................. 438/300; 257/E21.433

(58) Field of Classification Search ................ 438/300, 438/226; 257/E21.43, E21.433
See application file for complete search history.

(56) References Cited

U.S. PATENT DOCUMENTS 6,656,793 B2  12/2003  Jeong et al.
6,815,770 B1 * 11/2004  Chien et al. .................. 257/344
6,921,700 B2   7/2005  Orlowski et al.
2004/0206996 A1  10/2004  Lee et al.

OTHER PUBLICATIONS

Rajesh Rao, et al.—Multiple fin formation, Application No. 11/240,243, filed on Sep. 30, 2005.
International Search Report issued on Oct. 29, 2007 in related PCT Application.

* cited by examiner

*Primary Examiner*—David Vu
(74) *Attorney, Agent, or Firm*—David G. Dolezal

(57) ABSTRACT

Removing a portion of a structure in a semiconductor device to separate the structure. The structure has two portions of different heights. In one example, the structure is removed by forming a spacer over the lower portion adjacent to the sidewall of the higher portion. A second material is then formed on the structure outside of the spacer. The spacer is removed and the portion under the spacer is then removed to separate the structure at that location. In one embodiment, separate channel regions are implemented in the separated structures. In other embodiments, separate gate structures are implemented in the separated structures.

22 Claims, 8 Drawing Sheets

METHOD OF SEPARATING A STRUCTURE IN A SEMICONDUCTOR DEVICE

BACKGROUND OF THE INVENTION

1. Field of the Invention

This invention relates in general to semiconductor devices and more specifically to a method for separating structures of a semiconductor device.

2. Description of the Related Art

The isolation of structures in a semiconductor device may be performed using photo lithography techniques where the spacing is defined by the overlay and feature size permitted by the photolithography and etch process. Overlay between layers typically does not allow for the isolation of regions within sub-lithographic dimensions.

What is needed is an improved process for separating structures of a semiconductor device.

BRIEF DESCRIPTION OF THE DRAWINGS

The present invention may be better understood, and its numerous objects, features, and advantages made apparent to those skilled in the art by referencing the accompanying drawings.

The use of the same reference symbols in different drawings indicates identical items unless otherwise noted.

DETAILED DESCRIPTION

The following sets forth a detailed description of a mode for carrying out the invention. The description is intended to be illustrative of the invention and should not be taken to be limiting.

Figure 1:
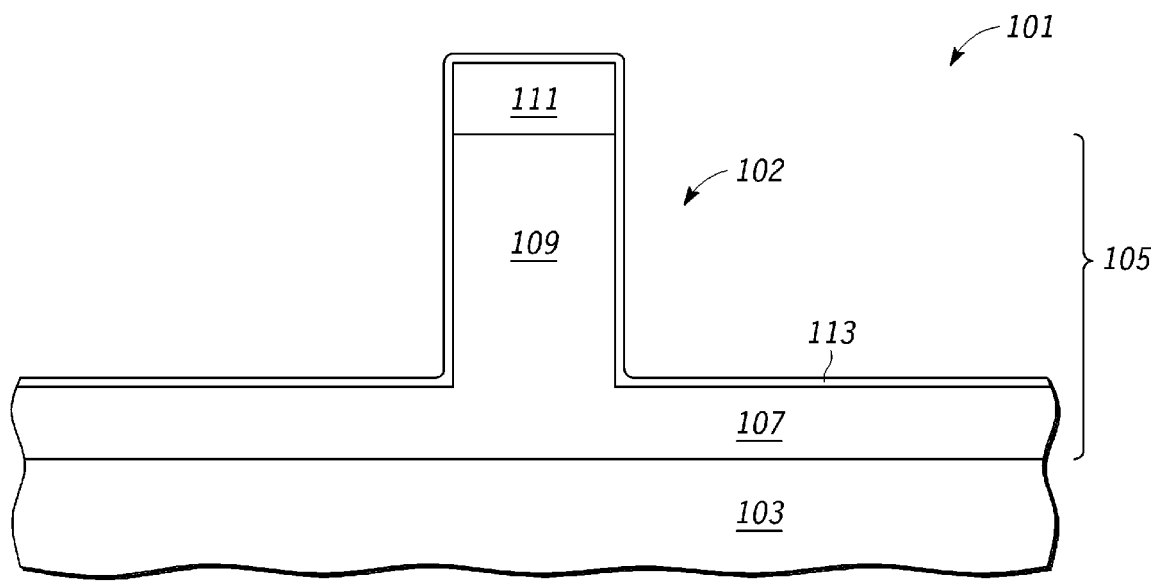
FIGS. 1-7 are partial side cutaway views of a wafer during various stages of its manufacture according to one embodiment of the present invention.

FIG. 1 is a partial side cutaway view of a wafer during a stage in its manufacture according to one embodiment of the present invention. Wafer 101 includes a dielectric layer 103 and a structure 102 located thereon. In one embodiment, layer 103 is located on a layer (not show) that may be made of bulk silicon or other material.

In the embodiment shown, structure 102 includes a first portion 109 and a second portion 107 that is contiguous with and adjacent to first portion 109. In one embodiment, portion 107 surrounds portion 109. In one embodiment, structure 102 is of a semiconductor material (e.g. monocrystalline silicon, monocrystalline germanium, silicon germanium, poly crystalline silicon, group III-V semiconductor materials) but may be of other materials in other embodiments.

A dielectric layer 113 is formed over structure 102. In one embodiment, layer 113 is an oxide liner deposited, e.g. by a chemical vapor deposition (CVD) process. In other embodiments, layer 113 may be thermally grown.

In one embodiment, structure 102 is formed from a layer 105 of semiconductor material by first forming a mask structure (e.g. nitride 111) over the layer 105 and then selectively etching the exposed portion of layer 105 to reduce the height of those portions with respect to the height of the unexposed portions (e.g. portion 109). In one embodiment, this etching may be performed with a dry etch for a predetermined time. In another embodiment, a trace material (e.g. germanium in silicon) may be formed in layer 105 during its growth at the level of the top of portion 107. The etching of layer 105 would then stop upon the detection of the trace material.

In one embodiment, portion 109 may be of a width less than the smallest photo lithographically defined dimension. In one embodiment, nitride 111 may be of the smallest photo lithographically defined dimension and subsequently trimmed to reduce its width before the etching of the layer to form structure 102. In other embodiments, portion 109 may be trimmed by oxidation of structure 102 and subsequent removal of oxide to reduced the width of portion 109.

Figure 2:
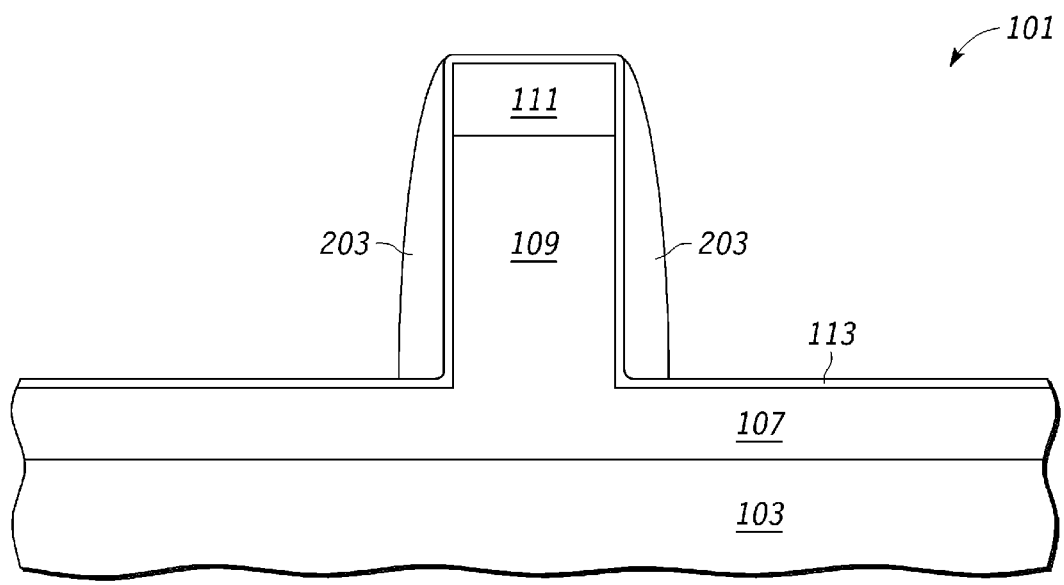

FIG. 2 shows a side view of wafer 101 after the formation of a spacer adjacent to the sidewalls of portion 109 and over portion of portion 107. In one embodiment, spacer 203 is of a nitride material but may be of other materials in other embodiments. In one embodiment, spacer 203 is formed by depositing a layer of nitride over wafer 101 and then anisotropically etching (e.g. a plasma dry etch) the layer to leave spacer 203.

Figure 3:
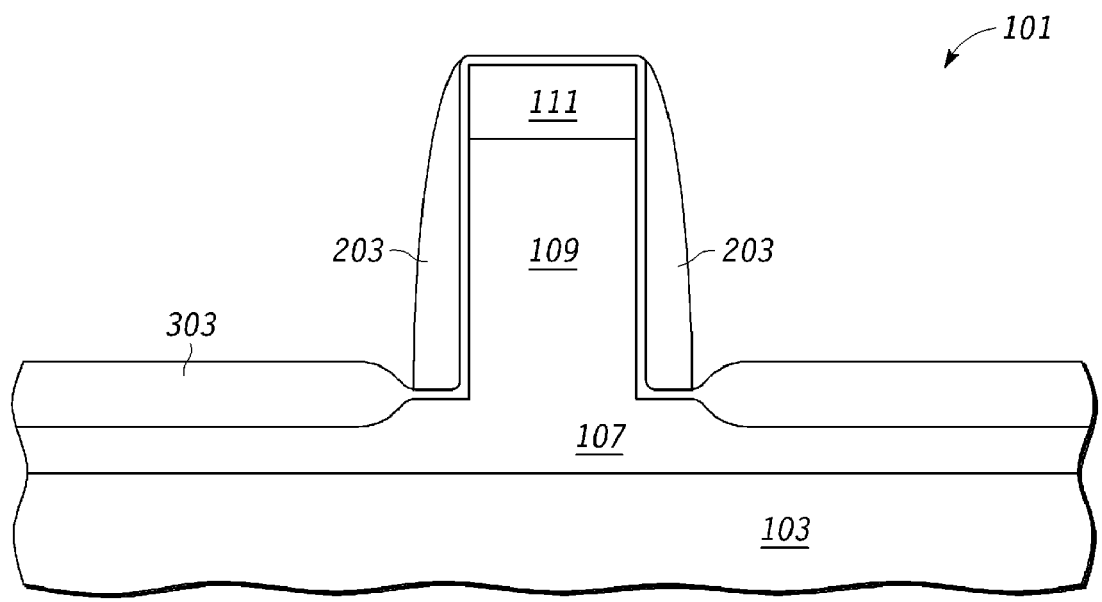

FIG. 3 shows a partial side view of wafer 101 after the wafer has been subject to an oxidation process to grow material 303 (oxide) on those portions of structure 102 not covered by spacer 203 and also not covered by nitride 111. The grown material (silicon oxide) is etch selective with respect to the spacer material (nitride). In other embodiments, spacer 203 and material 303 could be made of other materials. For example, spacer 203 could be an oxide and material 303 could be nitrided silicon.

In the embodiment shown, exposed portions of layer 113 is not removed prior to oxidation since oxygen diffuses through the oxide material of 113 and consumes part of the material to grow the silicon dioxide of material 303. However in other embodiments, the exposed portions of layer 113 maybe removed prior to growing material 303.

Figure 4:
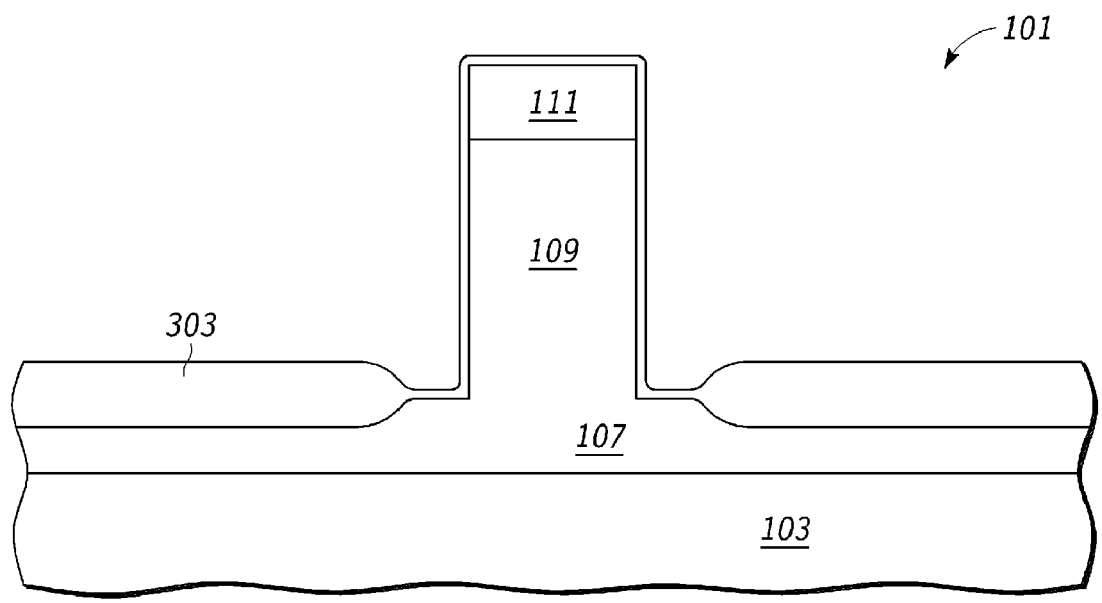

FIG. 4 is a partial side cutaway view of wafer 101 after spacers 203 have been removed. In one embodiment, the spacers are removed with an etch that is selective to the material of spacer 203 and selective with respect to material 303 such that material 303 (or a substantial portion of material 303) remains after the etching. In one example, spacers 203 are removed with an etch chemistry of that includes phosphoric acid.

In some embodiments, layer 113 may be removed at this time by a wet etch. Where layer 113 and material 303 are the same or non etch selective, a small top portion of material 303 may be removed as well.

Figure 5:
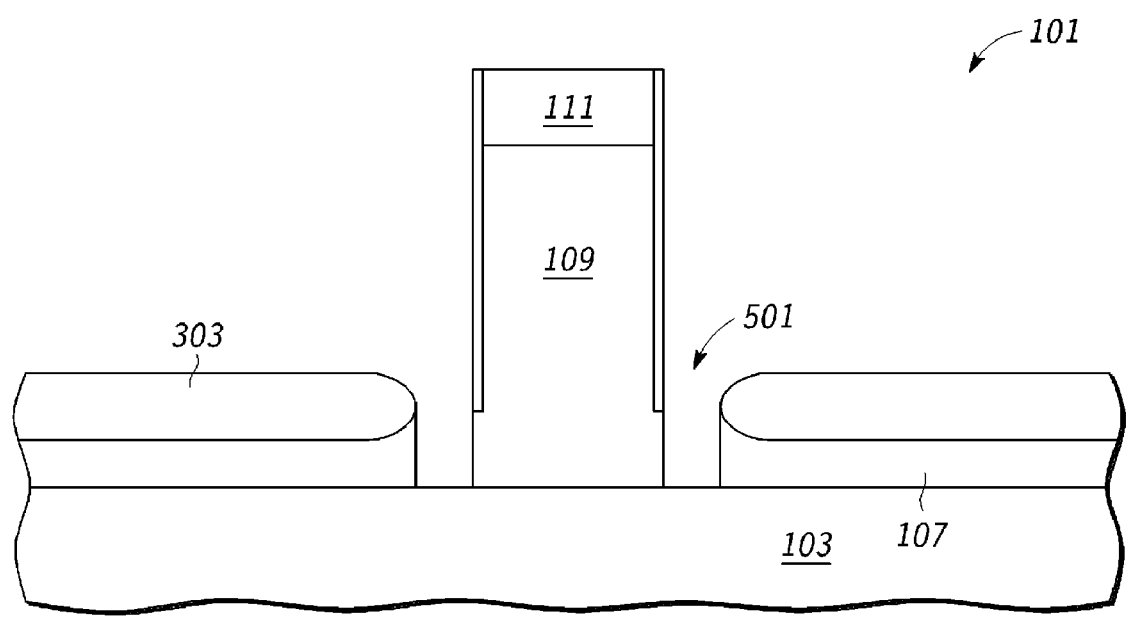

FIG. 5 is a partial side cutaway view of wafer 101 after opening 501 is formed in structure 102. In the embodiment shown, opening 501 is made by etching (e.g. anisotropic dry etch such as a plasma dry etch) the portion of portion 107 located outside of material 303 (the portion of portion 107 that was located under spacer 203). The dry etch is selective with respect to the material 303.

In one embodiment, opening 501 extends to dielectric layer 103. In some embodiments, a small portion of layer 103 may be removed during the etching.

Figure 6:
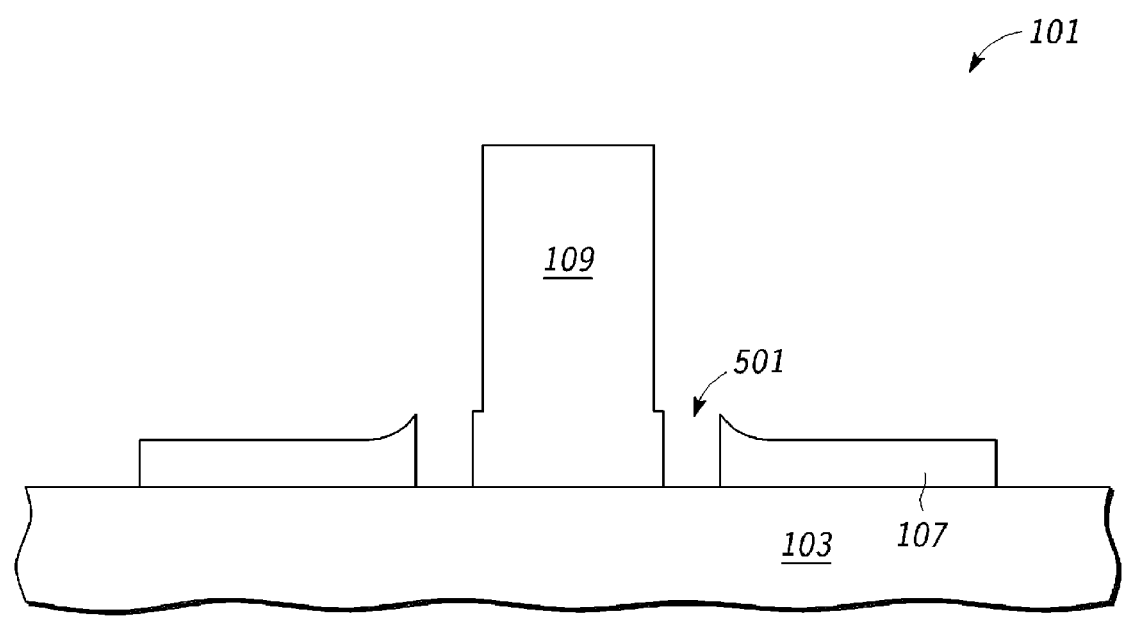

FIG. 6 is a partial side cutaway view of wafer 101 after the removal of material 303, layer 113, and mask nitride 111. Also, portions of portion 107 are removed. In one embodiment, a second spacer (not shown) is formed adjacent to the sidewall of portion 109 and covering the top portions of portions 107 and openings 501. Subsequently, the portions of portion 107 outside of this spacer are removed and then the spacer is removed. In other embodiments, the portions of portion 107 may be removed using a mask formed by photolithographic techniques.

Figure 7:
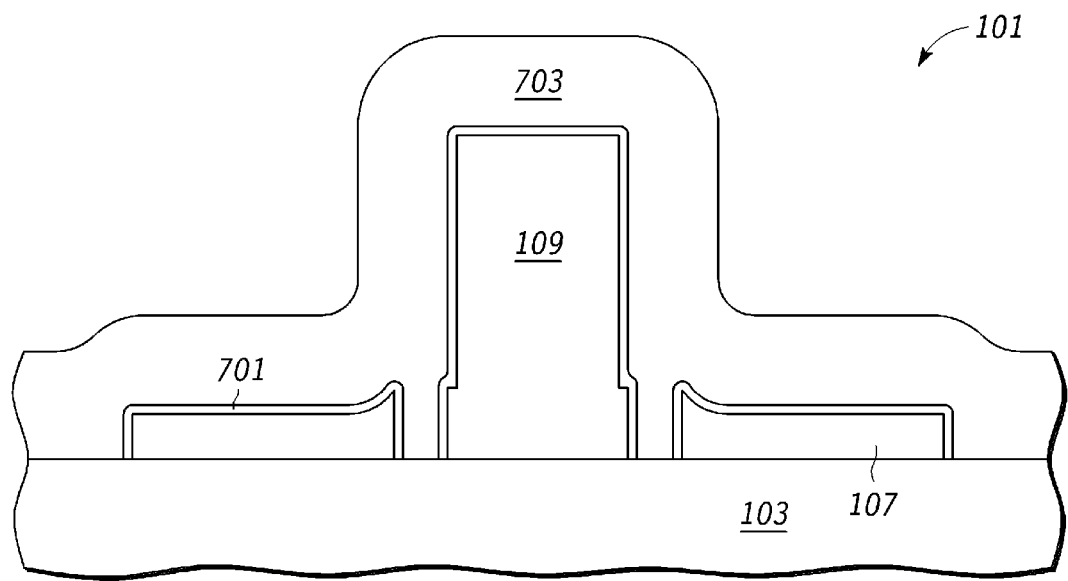

FIG. 7 is a partial side cutaway view of wafer 101 after a layer 701 of dielectric material is formed on portion 107 and portion 109 and a layer 703 of gate material (e.g. polysilicon, titanium nitride, tantalum carbide, or other types of metal, or combinations thereof) is formed over wafer 101.

Figure 8:
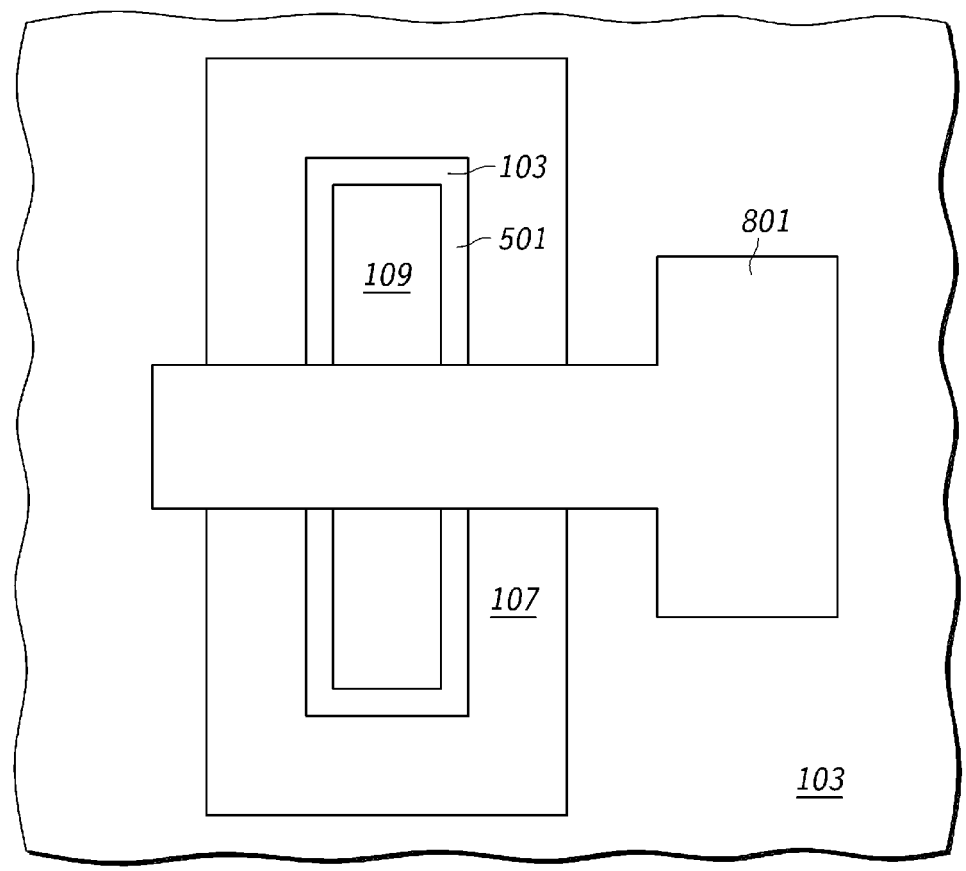
FIGS. 8-10 are partial top views of a wafer during various stages of its manufacture according to one embodiment of the present invention.

FIG. 8 is a partial top view of wafer 101 after gate layer 703 is patterned to form gate structure 801. In the embodiment shown, opening 501 surrounds portion 109. However, in other embodiments, portion 109 is not surrounded by a single opening but by multiple openings located around portion 109.

Figure 9:
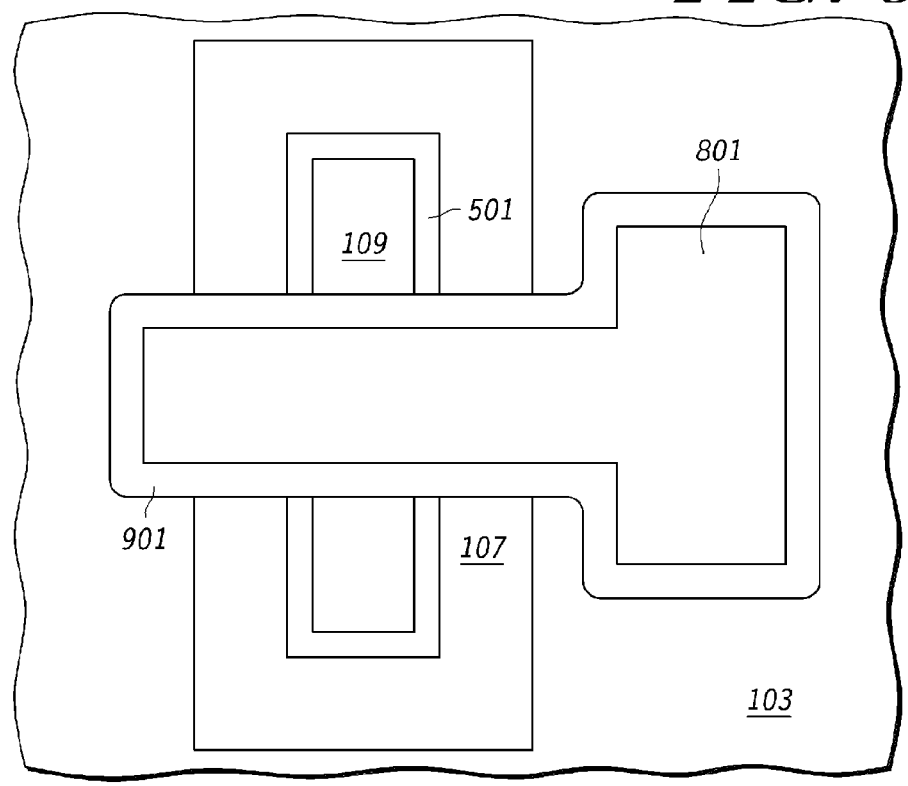

FIG. 9 is a partial top view of wafer 101 after a spacer 901 is formed around gate structure 801. In one embodiment, spacer 901 is made nitride but may be made of other materials in other embodiments.

In the embodiment shown, spacer 901 is confined to gate structure 801 sidewalls by making structure 801 to a greater height than portion 109 and over etching spacer 901 from the sidewalls of portion 109.

Figure 10:
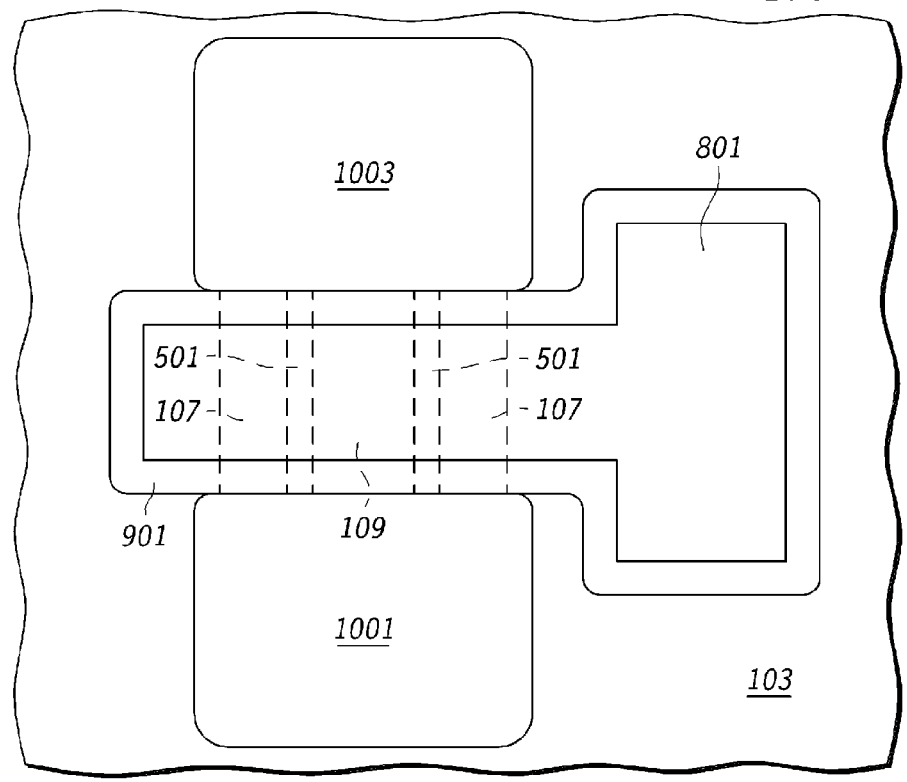

FIG. 10 is a partial top view of wafer 101 after epitaxial silicon is selectively grown on regions of exposed silicon including on exposed portions of portion 109 and portion 107 to form silicon regions 1003 and 1001. In subsequent embodiments, regions 1001 and 1003 will be implanted with a dopant to form source/drain regions (or other types of current electrode structures of other types of transistors).

Gate structure 801 serves as a gate for a transistor. The channel regions for the transistor are located along the vertical sidewalls and top of portion 109 and along the vertical sidewalls and top of portions 107 under gate structure 801. Accordingly, a MOSFET transistor is provided with multiple channel regions having a shared gate, source, and drain.

By forming opening 501 in structure 102, the channel regions in portions 107 and portion 109 can be physically separated under gate structure 801, wherein the entire sidewall of portion 109 is controlled by gate structure 801, thereby reducing short channel effects such as loss of gate control in the bottom portion of portion 109.

Utilizing the formation of spacers to remove portions of portion 107 to separate portion 107 from portion 109 may allow for the use of sublithographic and self aligned definition of separation openings (e.g. 501) to achieve the above separation.

In subsequent processes, other procedures are performed on wafer 101 including slicidation of gate structure 801 and regions 1001 and 1003, the formation of contacts to gate structure 801 and regions 1001 and 1003, the formation of interconnect layers including interconnects and interlayer dielectrics, and the formation of external conductors (e.g. bond pads). Afterwards, wafer 101 may be singulated into individual integrated circuits and packaged into integrated circuit packages.

Figure 11:
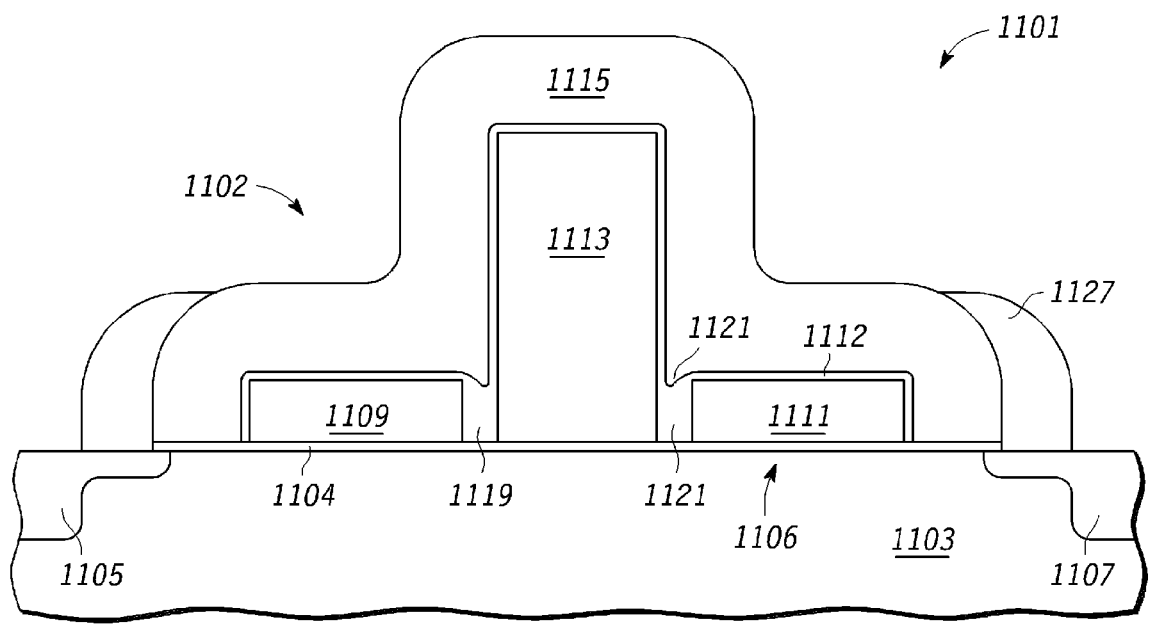
FIGS. 11 is a partial side cutaway view of a wafer during a stage in its manufacture according to another embodiment of the present invention.

FIG. 11 shows a partial side view of another wafer according to another embodiment of the present invention. Wafer 1101 includes a non volatile memory cell 1102 formed thereon. Wafer 1101 includes a substrate 1103 (e.g. bulk silicon or semiconductor on insulator (SOI) substrate) on which a gate dielectric 1104 is formed thereon. Cell 1102 includes three floating gate structures 1109, 1113, and 1111 formed from of a polysilicon layer or other gate material for storing charge to store one or more bits of information. Cell 1102 includes a control gate 1115 (e.g. of polysilicon or other control gate material) and spacers 1127 formed for isolating gate 1115 from the source/drain regions 1105 and 1107 formed in substrate 1103.

In one embodiment, floating gate structures 1109, 1113, and 1111 are formed from a structure similar to structure 102, where one structure 1113 has a greater height than other structures (1119 and 1111). Furthermore, in one embodiment, openings 1119 and 1121 are formed in a similar manner (e.g. with the use of sacrificial spacers such as spacer 203) to remove the portion of the structure to separate structures 1109 and 1111 from structure 1113. In other embodiments, the layer from which gate 1115 was formed may be patterned with structures 1111 and 1109.

In one embodiment, memory cell 1102 advantageously has 3 separate memory storage structures (e.g. 1109, 1113, and 1111) which may provide for a higher reliability than a memory cell with just one structure.

In other embodiments, cell 1102 may store multiple bits, where one bit of information is stored in structure 1111 and the other bit is stored in structure 1109.

In one embodiment, the width of structure 1113 may be reduced by trimming prior to forming openings 1119 and 1121 by oxidation and subsequent removal of the oxide. The portion of the structure that is used to formed structures 1109 and 1111 protects the substrate layer 1103 during this oxidation and oxide removal.

Figure 12:
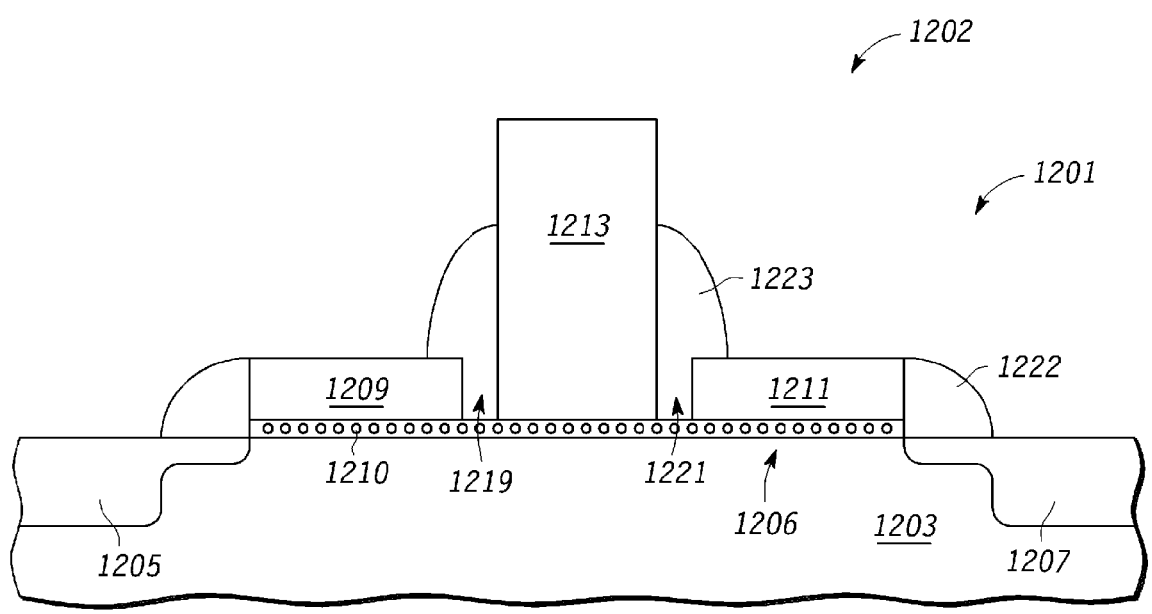
FIGS. 12 is partial side cutaway view of a wafer during a stage in its manufacture according to another embodiment of the present invention.

FIG. 12 is a partial side cutaway view of wafer 1201. Wafer 1201 includes non volatile memory cell 1202. Memory cell 1202 includes control gate structures 1209, 1213, and 1211 which are made of a control gate material (e.g. polysillicon, metal, polysilicon germanium). Cell 1202 includes a charge storage layer 1210 which in one embodiment includes embedded silicon nanocrystals in dielectric material for storing charge. In other embodiments, layer 1210 may include other charge storage materials such as nitride. Layer 1210 is located on substrate 1203 (e.g. bulk silicon or SOI substrate). Source/drain regions 1205 and 1207 and channel region 1206 are located in substrate 1203. Cell 1202 also includes dielectric spacers 1222 and 1223.

In one embodiment, structures 1209, 1213, and 1211 are formed from a structure similar to structure 102. In one embodiment, openings 1219 and 1221 are formed in a similar manner (with a sacrificial spacer) as opening 501.

In one embodiment, each of structures 1209, 1213, and 1211 are separately bias able (e.g. with contacts not shown). Charge may be independently stored and read in the memory storage layer 1210 corresponding to each of gates structures 1209, 1213, and 1211.

The use of a sacrificial spacer to separate the control gate structures may allow for a cell to have separate control gate structures whose separation is less than that possible by lithographic methods. Accordingly, such a method may provide for a more compact memory.

FIGS. 13-16 show partial cutaway side views of another embodiment according to the present invention. FIGS. 13-16 show an alternative embodiment of successive stages in the manufacture of wafer 101 from its state as shown in FIG. 2.

Figure 13:
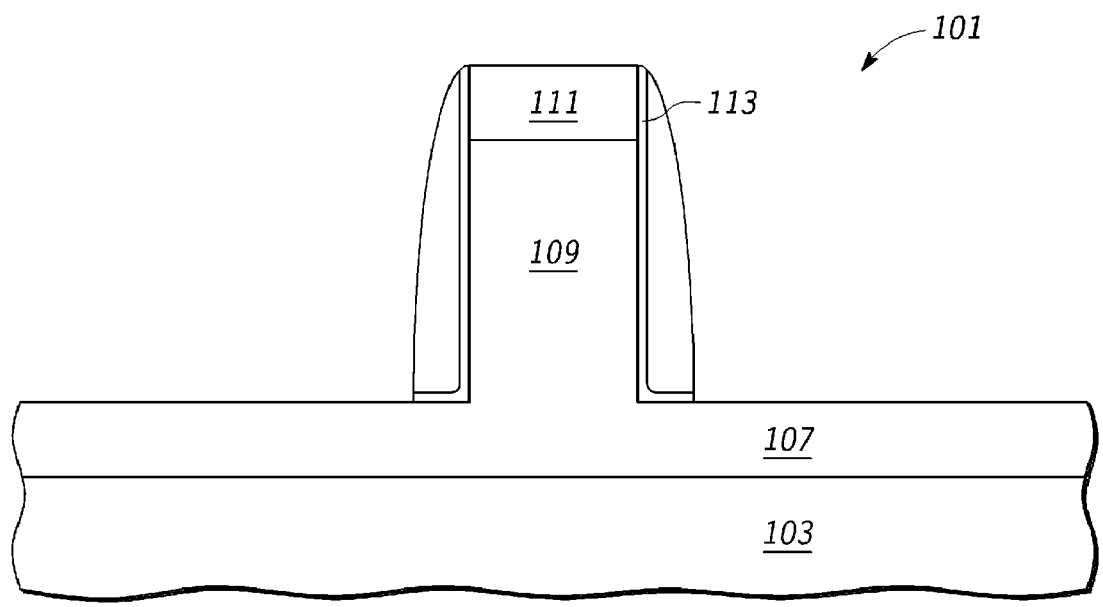
FIGS. 13-16 are partial side cutaway views of a wafer during various stages of its manufacture according to another embodiment of the present invention.

FIG. 13 is a partial side view of wafer 101 after exposed portions of layer 113 are removed from a stage as shown in FIG. 2. In one embodiment, the exposed portions of layer 113 are removed with a wet or dry etch that is selective to the oxide of layer 201.

Figure 14:
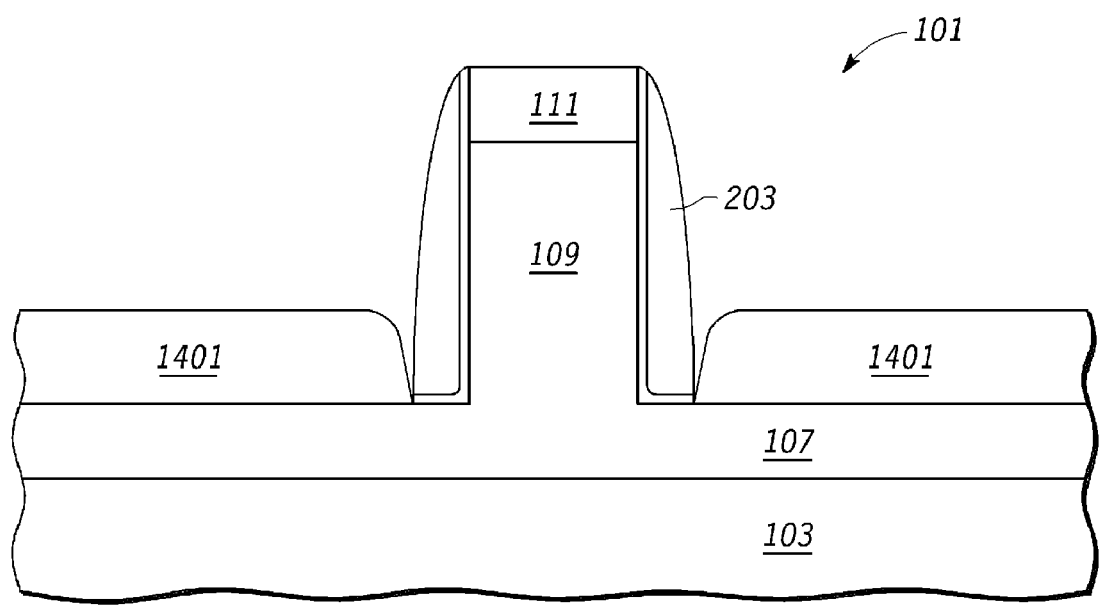

FIG. 14 shows a partial side view of wafer 101 after silicon 1401 is epitaxially grown on exposed portions of portion 107 adjacent to spacers 203. In one embodiment, silicon 1401 is grown such that the height of grown silicon 1401 is thicker than the height of portion 107 below spacer 203. In other embodiments, other types of materials may be epitaxially grown on portion 107.

Figure 15:
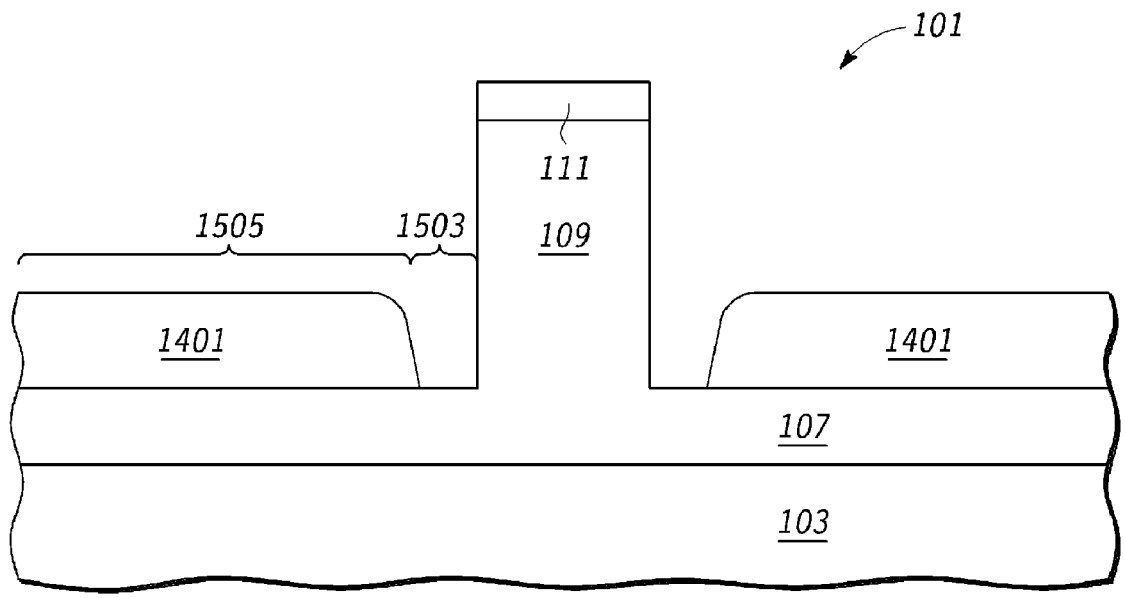

FIG. 15 shows a partial cutaway side view of wafer 101 after spacers 203, the remaining portion of layer 113, and a portion of nitride 111 is removed. In one embodiment, these structures are removed by an etchant that is selective to those structures and selective with respect to the material of portions 107 and 109 and grown silicon 1401. In some embodiments, the nitride of spacers 203 (and nitride 111) would be etched first with an etch chemistry selective to the nitride of those structures and then a second etch selective to the exposed portions of layer 113 to remove those portions.

The resultant form of wafer 101 at the stage of FIG. 15 includes portions adjacent to portion 109 having two different heights. At location 1505, the height of the semiconductor material is the thickness of the grown silicon 1401 plus the thickness of portion 107. The height of the semiconductor material at location 1503 is just the thickness of portion 107.

Figure 16:
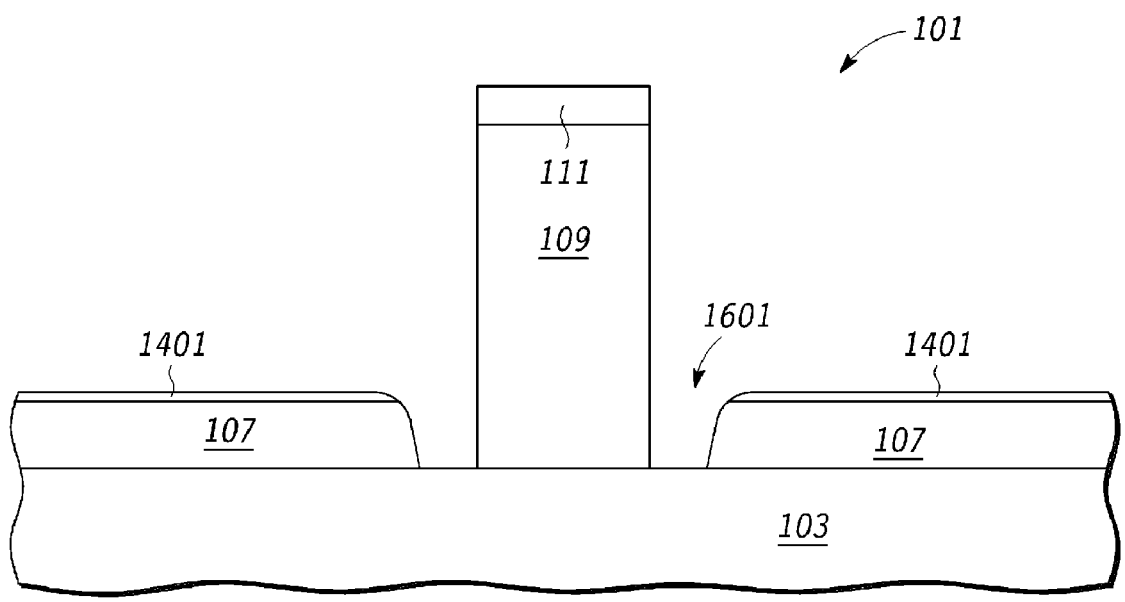

FIG. 16 shows a partial side cutaway view of wafer 101 after it has been subjected to an anisotropic etch to remove the semiconductor material of location 1503 to isolate the semiconductor material at location 1505 from portion 109. Because the height of the semiconductor material at location 1505 is greater than the height of the semiconductor material at location 1503, location 1505 includes semiconductor material after the anisotropic etch where as no semiconductor material remains at location at 1503. In one embodiment, the anisotropic etch is selective to the material of grown silicon 1401, portion 107, and portion 109 and selective with respect to nitride 111 and the oxide of layer 103. In one embodiment, the anisotropic etch is preformed until an oxide end trace is detected followed by an over etch for a predetermined time. In another embodiment, the semiconductor material is etched for a predetermined time.

In some embodiments, a dielectric layer (not shown) may be formed between nitride 111 and portion 109, thereby preventing portion 109 from being etched even if nitride 111 is removed during spacer 203 removal.

In other embodiments, at least some amount of epitaxially grown silicon 1401 may be oxidized to form an oxide (similar to the formation of material 303 in FIG. 3) prior to the removal of spacers 203. This addition oxide would be removed after the removal of spacer 203 and after the removal of the material of portion 107 at location 1503.

In different embodiments, the resultant structure shown in FIG. 16 may be further processed to form similar devices shown in FIGS. 7, 11, or 12 or other types of devices described herein. With some of these embodiments, the material of portions 109 and 107 may be different, e.g. depending on the device to be formed.

Although in the embodiments shown, sacrificial spacers are used to separate one portion of a structure of a first height from a structure or structures of lower heights, the use of sacrificial spacers may be utilized to separate structures having multiple portions with a first higher height from portions having lower heights. For example, the use of sacrificial spacers may be used to separate the fins of a multi-fin semiconductor structure from intervening portions of the structure of lower heights. In such embodiments, spacers would be formed adjacent to each sidewall of the each fin structure of the multi fin structure.

In one embodiment, a method of forming a semiconductor device includes forming a structure comprising a first portion and a second portion. The first portion has a first height and the second portion has a second height. The first height is greater than the second height. The first portion and the second portion are contiguous. The method includes forming a spacer adjacent a sidewall of the first portion and over a first top portion of the second portion. The spacer being of a first material. The method also includes forming a second material over a second top portion of the second portion of the structure after the forming the spacer. The first material is etch selective with respect to the second material. The method also includes exposing the first top portion of the second portion of the structure. The exposing includes removing the spacer over the first top portion. The method still further includes removing material of the structure at a location of the first top portion to separate the first portion from the second portion at the location of the first top portion.

In another embodiment, a method of forming a structure of a transistor includes forming a semiconductor structure comprising a first portion and a second portion. The first portion has a first height and the second portion has a second height. The first height is greater than the second height. The first portion and the second portion are contiguous. The method includes removing portions of the structure between the first portion and the second portion, forming a layer of gate material over the first portion and the second portion, and patterning the layer of gate material to form a gate structure over the first portion and the second portion. The method also includes selectively growing a material to rejoin the first portion and the second portion at a location outside of the gate structure and implementing at least a portion of a current electrode region in a region of the material selectively grown. A first channel region is located along a sidewall of the first portion under the gate structure and a second channel region is located along the top surface of the second portion under the gate structure. The first channel region and the second channel region are coupled to the current electrode region.

In another embodiment, a method of forming a transistor includes providing a dielectric layer over a substrate and forming a structure over the dielectric layer. The structure includes a first portion and a second portion. The first portion has a first height and the second portion has a second height. The first height is greater than the second height. The first portion and the second portion are contiguous. The method also includes removing portions of the structure between the first portion and the second portion to form an opening, forming a first current electrode region in the substrate, and forming a second current electrode region in the substrate. A channel region separates the first current electrode region from the second current electrode region. The opening includes a portion located over the channel region. The method further includes implementing a first gate structure in the first portion and implementing a second gate structure in the second portion.

While particular embodiments of the present invention have been shown and described, it will be recognized to those skilled in the art that, based upon the teachings herein, further changes and modifications may be made without departing from this invention and its broader aspects, and thus, the appended claims are to encompass within their scope all such changes and modifications as are within the true spirit and scope of this invention.

What is claimed is:

1. A method of forming a semiconductor device comprising:

forming a structure comprising a first portion and a second portion, the first portion having a first height and the second portion having a second height, the first height is greater than the second height, wherein the first portion and the second portion are contiguous;

forming a spacer adjacent a sidewall of the first portion and over a first top portion of the second portion, the spacer being of a first material;

forming a second material over a second top portion of the second portion of the structure after the forming the spacer, the first material is etch selective with respect to the second material;

exposing the first top portion of the second portion of the structure, wherein the exposing includes removing the spacer over the first top portion;

removing material of the structure at a location of the first top portion to separate the first portion from the second portion at the location of the first top portion.

2. The method of claim 1 wherein the structure is of a material that includes a monocrystalline semiconductor material.

3. The method of claim 1 wherein the structure is located over a layer of dielectric material, wherein the removing material of the structure exposes the layer of dielectric material.

4. The method of claim 1 wherein the structure is of a material that includes polycrystalline silicon.

5. The method of claim 1 wherein a first control gate is implemented in the first portion and a second control gate is implement in the second portion.

6. The method of claim 1 wherein the first material includes nitride and the second material includes oxide.

7. The method of claim 1 wherein the forming the second material includes epitaxially growing material from the second top portion of the second portion of the structure.

8. The method of claim 7, further comprising oxidizing material of the epitaxially grown material over the second top portion of the second portion.

9. The method of claim 1 further comprising:
forming a dielectric layer over the structure including on the sidewall before the forming the spacer, wherein the spacer is formed on a sidewall of the dielectric layer on the sidewall of the first portion and on the dielectric layer on the first top portion.

10. The method of claim 1 wherein the removing the material of the structure at the location of the first top portion includes etching the material with an anisotropic etch.

11. The method of claim 1 further comprising:
forming a gate structure over the first portion and the second portion after the removing;
selectively growing a material to rejoin the first portion and the second portion at a location outside of the gate structure.

12. The method of claim 1 further comprising:
implementing a first floating gate structure in the first portion and implementing a second floating gate structure in the second portion.

13. The method of claim 1 wherein the structure is formed over a layer of charge storage material.

14. The method of claim 13 wherein the charge storage material includes silicon nanocrystals.

15. The method of claim 1 wherein the structure includes silicon and the forming the second material includes oxidizing the silicon.

16. The method of claim 1 wherein the structure includes silicon and the forming the second material includes epitaxially growing silicon.

17. The method of claim 1 further comprising:
forming a layer of gate material over the structure after the removing.

18. The method of claim 1 wherein a first channel region is implemented in first portion and a second channel region is implemented in the second portion.

19. The method of claim 1 wherein implementing at least a portion of a current electrode region in the first portion and the second portion.

20. A method of forming a structure of a transistor, the method comprising:
forming a semiconductor structure comprising a first portion and a second portion, the first portion having a first height and the second portion having a second height, the first height is greater than the second height, wherein the first portion and the second portion are contiguous;
removing portions of the structure between the first portion and the second portion;
forming a layer of gate material over the first portion and the second portion;
patterning the layer of gate material to form a gate structure over the first portion and the second portion;
selectively growing a material to rejoin the first portion and the second portion at a location outside of the gate structure;
implementing at least a portion of a current electrode region in a region of the material selectively grown;
wherein a first channel region is located along a sidewall of the first portion under the gate structure and a second channel region is located along a top surface of the second portion under the gate structure, the first channel region and the second channel region are coupled to the current electrode region.

21. A method of forming a transistor, the method comprising:
providing a dielectric layer over a substrate;
forming a structure over the dielectric layer, the structure comprising a first portion and a second portion, the first portion having a first height and the second portion having a second height, the first height is greater than the second height, wherein the first portion and the second portion are contiguous;
removing portions of the structure between the first portion and the second portion to form an opening;
forming a first current electrode region in the substrate;
forming a second current electrode region in the substrate;
wherein a channel region separates the first current electrode region from the second current electrode region, wherein the opening includes a portion located over the channel region;
implementing a first gate structure in the first portion;
implementing a second gate structure in the second portion.

22. The method of claim 21 further comprising:
forming a charge storage layer over the substrate, wherein the structure is formed over the charge storage layer.

* * * * *